United States Patent
Kim

(10) Patent No.: US 7,361,562 B2
(45) Date of Patent: Apr. 22, 2008

(54) METHOD OF MANUFACTURING SEMICONDUCTOR DEVICE

(75) Inventor: Hak-Dong Kim, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/023,844

(22) Filed: Dec. 27, 2004

(65) Prior Publication Data

US 2005/0142772 A1 Jun. 30, 2005

(30) Foreign Application Priority Data

Dec. 27, 2003 (KR) ............... 10-2003-0098383

(51) Int. Cl.
*H01L 21/336* (2006.01)
*H01L 21/76* (2006.01)

(52) U.S. Cl. ............... 438/289; 438/306; 438/431

(58) Field of Classification Search ............ 438/287, 438/289, 306, 231, 431
See application file for complete search history.

(56) References Cited

U.S. PATENT DOCUMENTS

| 6,248,618 | B1 * | 6/2001 | Quek et al. ............ 438/199 |
| 6,294,416 | B1 * | 9/2001 | Wu ...................... 438/199 |
| 6,376,318 | B1 * | 4/2002 | Lee et al. ............. 438/300 |
| 6,677,212 | B1 * | 1/2004 | Yoshioka et al. ...... 438/303 |
| 6,933,214 | B2 * | 8/2005 | Kwak .................. 438/522 |
| 2002/0055220 | A1 * | 5/2002 | Soderbarg et al. ..... 438/234 |
| 2003/0119263 | A1 * | 6/2003 | Lee et al. ............. 438/259 |

* cited by examiner

*Primary Examiner*—Hsien-Ming Lee
(74) *Attorney, Agent, or Firm*—Andrew D. Fortney

(57) ABSTRACT

Provided is a method of manufacturing a semiconductor device capable of forming a thin high-quality gate oxide layer by suppressing occurrence of recoiled oxygen due to ion implanting. The method of manufacturing a semiconductor device includes steps of: removing an oxide layer from a semiconductor substrate; forming a well region in the substrate by performing a first ion implanting process; removing a native oxide layer from the substrate; adjusting a threshold voltage by performing a second ion implanting process on the substrate; and forming a gate oxide layer on the substrate.

11 Claims, 3 Drawing Sheets

METHOD OF MANUFACTURING SEMICONDUCTOR DEVICE

BACKGROUND OF THE INVENTION (a) Field of the Invention

The present invention relates to a method of manufacturing a semiconductor device, and more particularly, to a method of forming a gate oxide layer of a semiconductor.

(b) Description of the Related Art

Oxide layers have been used as a useful insulating layer in technologies for manufacturing semiconductor devices. The oxide layers such as gate insulating layers of MOS transistor devices have been used as an insulating structure for blocking carriers and providing electrical insulation between elements in the semiconductor devices. In addition, the oxide layers have been used as a field structure such as a LOCOS and a trench isolation structure for inhibiting the inadvertent formation of conductive paths between devices in an integrated circuit. In addition, the oxide layers have been used as a diffusion barrier for selectively doping or diffusing a predetermined ion or impurity on a silicon substrate in an ion implanting or diffusing process. Oxide layers have also been used as an etch stopper in dry and/or wet etching processes. As described above, oxide layers have been used for various purposes in semiconductor manufacturing processes because oxide layers are generally not reactive to most chemical solutions.

Oxide layers have various thicknesses according to the uses thereof. For example, an oxide layer used as an interlayer insulating layer generally has a predetermined minimum thickness. On the other hand, an oxide layer used as a gate insulating layer should be relatively thin.

In a case where the oxide layer is used as the gate insulating layer, the quality of the oxide layer and characteristics of devices, as well as the thickness of the oxide layer, are important. In particular, conventionally, an ion implanting process for forming a well region has generally been performed prior to forming the gate insulating layer.

However, in the above cases, there is a problem in that recoiled oxygen is induced by the ion implanting process, so that the thickness of the oxide layer formed in a subsequent process may inadvertently increase. As the projected range Rp (or projected range of implant depth) is lower and ion dose is higher, the amount of recoiled oxygen becomes larger. Therefore, the thickness of the oxide layer may increase and the quality thereof may deteriorate.

SUMMARY OF THE INVENTION

In order to solve the aforementioned problems, an object of the present invention is to provide a method of manufacturing a semiconductor device capable of forming a thin high-quality gate oxide layer by suppressing occurrence of recoiled oxygen due to ion implanting.

According to an aspect of the present invention, there is provided a method of manufacturing a semiconductor device, comprising steps of: removing an oxide layer on a semiconductor substrate; forming a well region in the substrate by performing a first ion implanting process; removing a native oxide layer on the substrate; adjusting a threshold voltage by performing a second ion implanting process on the substrate; and forming a gate oxide layer on the substrate.

In one aspect of the present invention, the step of removing the native oxide layer may comprise treating the native oxide layer with a dilute HF (DHF) solution.

In addition, the method may further comprise a step of cleaning the upper surface of the semiconductor substrate prior to the step of forming the gate oxide layer, and/or the gate oxide layer may have a thickness of from 10 to 20 Å.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Now, exemplary embodiments of the present invention will be described with reference to the attached drawings. However, the present invention can be embodied in various modifications and thus is not limited to the embodiments described below.

Figure 1:
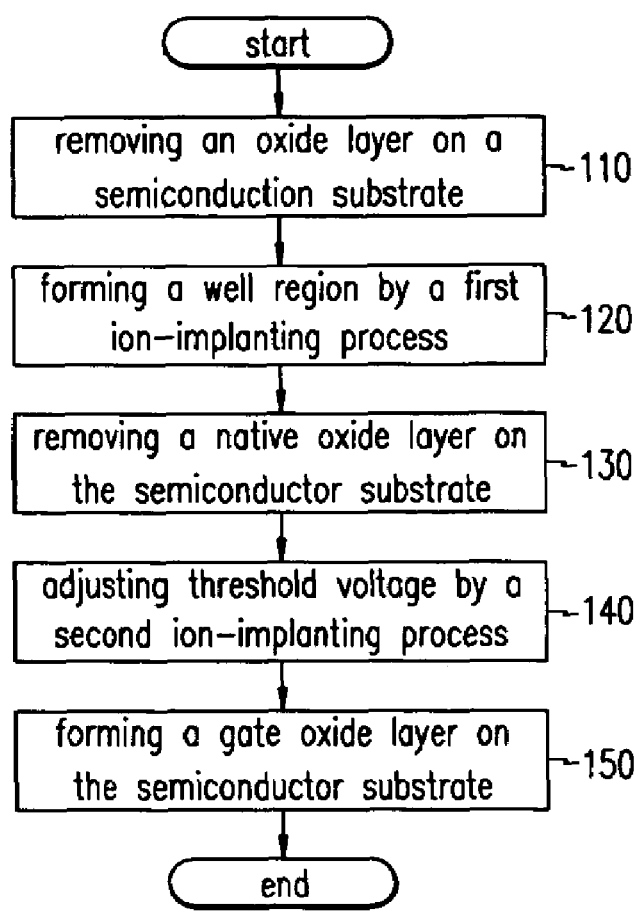
FIG. 1 is a flowchart showing steps of a method of forming a gate oxide layer according to the present invention.

FIG. 1 is a flowchart showing steps of a method of forming a gate oxide layer according to the present invention, and FIGS. 2A to 2D are cross sectional views for explaining the steps of FIG. 1.

Figure 2A:
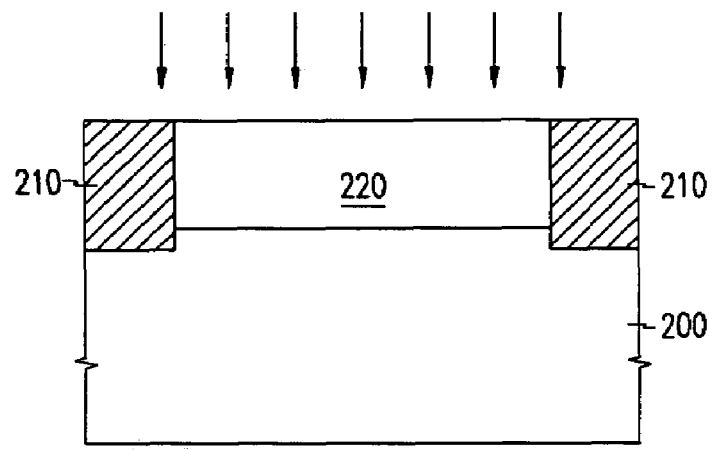
FIGS. 2A to 2D are cross sectional views for explaining the steps of FIG. 1.

Referring to FIG. 2A, the entirety of an oxide layer (not shown) on semiconductor substrate 200 where an active region is defined by isolation structures 210 is removed (step 110 in FIG. 1). The oxide layer removed in step 110 is generally used in forming isolation structures 210 and is sometimes known as a "pad oxide." Next, as indicated with arrows in FIG. 2A, a first ion implanting process is performed using a predetermined mask pattern (not shown) to form a well region 220 in the active region of the semiconductor substrate 200 (see step 120 in FIG. 1). The first ions implanted into semiconductor substrate 200 to form a well region 220 may comprise a p-type dopant, such as boron (B), or an n-type dopant, such as phosphorous (P) or arsenic (As).

Figure 2B:
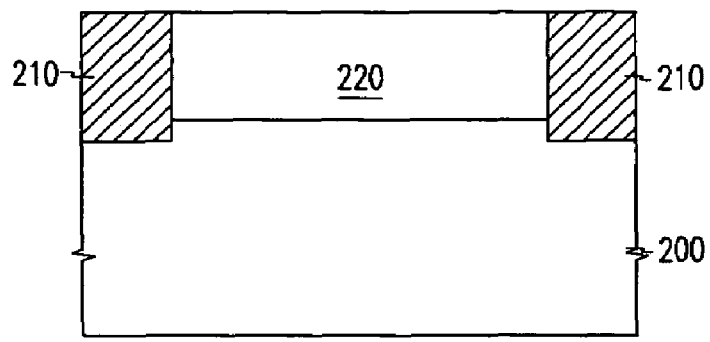

After the first ion implantation step 120, a native oxide layer may grow on the surface of semiconductor substrate 200 (e.g., on well region 220) from, e.g., exposure of the substrate 200 to air, oxygen, ozone, or another oxygen atom source. Thus, the step of "forming a native oxide layer" does not necessary require affirmative action; it may involve simply allowing the native oxide to form by exposure (inadvertent or otherwise) to a source of oxygen atoms. The native oxide layer is generally on the order of 10-20 Å thick. Referring to FIG. 2B, the native oxide layer on the well region 220 of the semiconductor substrate 200 is removed (step 130 in FIG. 1). The native oxide layer may be removed with a dilute HF (DHF) solution (which may be buffered with a conventional buffering agent, such as ammonia). The (buffered) DHF used in conventional cleaning processes is suitable for the present native oxide removal step.

Figure 2C:
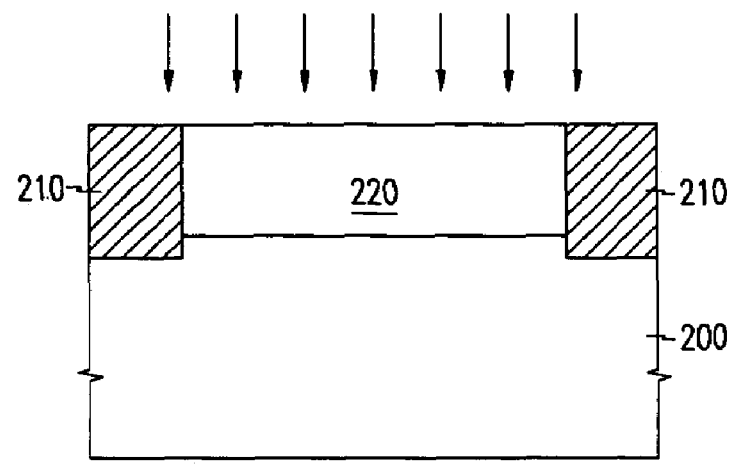

Referring to FIG. 2C, as indicated with arrows, a transistor threshold voltage is adjusted by performing a second ion implanting process in the semiconductor substrate 200 where the native oxide layer has been removed (step 140 in FIG. 1). The second ions implanted into semiconductor substrate 200 to form a threshold voltage adjustment implant 224 may comprise a p-type dopant, such as boron (B) and/or indium (In), or an n-type dopant, such as phosphorous (P), arsenic (As) and/or antimony (Sb). In one embodiment, the second implanted ions are the same type as the first implanted ions, but the average atomic weight of the second ions may be greater than the average atomic weight of the first ions. The second ion implanting process may be performed using an ion implanting mask (e.g., conventional photoresist; not shown) in a predetermined mask pattern.

Figure 2D:
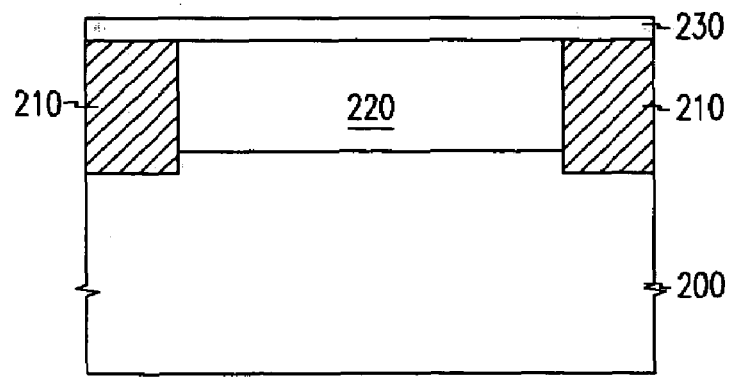

Referring to FIG. 2D, a gate oxide layer 230 is formed on the semiconductor substrate 200 over the well 220, where the threshold voltage has been adjusted (step 150 in FIG. 1). Here, it is preferable that the upper surface of the semiconductor substrate 200 be cleaned prior to forming the gate oxide layer 230. The gate oxide layer 230 may have a thickness of from 10 to 20 Å.

As described above, in a method of forming a gate oxide layer of a semiconductor device according to the present invention, an oxide layer on a semiconductor substrate is removed prior to performing an ion implanting process, so that it is possible to minimize recoiled oxygen due to ion implanting. Therefore, it is possible to form a desired thin gate oxide layer.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a semiconductor device, comprising steps of:

removing an oxide layer from a semiconductor substrate to expose the entire surface of the substrate;

forming a well region in the substrate by implanting first ions into the exposed surface of the substrate;

after forming said well region, removing a native oxide layer from the substrate to re-expose the entire surface of the substrate;

after removing said native oxide layer, adjusting a threshold voltage by implanting second ions into the entire re-exposed surface of the substrate; and forming a gate oxide layer on the substrate after implanting the second ions to adjust the threshold voltage.

2. The method of claim 1, wherein the step of removing the native oxide layer comprises treating the native oxide layer with a solution comprising dilute HF (DHF).

3. The method of claim 2, wherein the solution comprises buffered DHF.

4. The method of claim 1, further comprising a step of cleaning the entire surface of the semiconductor substrate prior to the step of forming the gate oxide layer.

5. The method of claim 1, wherein the gate oxide layer has a thickness of 10 to 20 Å.

6. The method of claim 1, further comprising allowing the native oxide layer to grow on the semiconductor substrate after the step of forming the well region.

7. The method of claim 1, further comprising forming the native oxide layer by exposing the substrate to a source of oxygen atoms.

8. The method of claim 7, wherein the source of oxygen atoms comprises air, oxygen, or ozone.

9. The method of claim 1, wherein the native oxide layer has a thickness of about 10-20 Å.

10. The method of claim 1, wherein the second ions have a same conductivity type as the first ions and an average atomic weight greater than an average atomic weight of the first ions.

11. The method of claim 10, wherein the first ions are boron ions and the second ions are boron ions and/or indium ions, or the first ions are phosphorous or arsenic and the second ions are phosphorous, arsenic, and/or antimony.

* * * * *